US006848094B2

(12) United States Patent
Andreev et al.

(10) Patent No.: US 6,848,094 B2
(45) Date of Patent: Jan. 25, 2005

(54) NETLIST REDUNDANCY DETECTION AND GLOBAL SIMPLIFICATION

(75) Inventors: Alexander E. Andreev, San Jose, CA (US); Igor A. Vikhliantsev, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 76 days.

(21) Appl. No.: 10/334,731

(22) Filed: Dec. 31, 2002

(65) Prior Publication Data

US 2004/0128632 A1 Jul. 1, 2004

(51) Int. Cl.$^7$ .................................................. G06F 17/50

(52) U.S. Cl. .............................. 716/12; 326/35; 716/1; 716/2; 716/14; 716/15

(58) Field of Search ............................ 716/1, 2, 12, 14, 716/15, 13; 326/35

(56) References Cited

U.S. PATENT DOCUMENTS

| | | | | |
|---|---|---|---|---|
| 5,828,228 A | * | 10/1998 | Fant et al. | ...................... 326/35 |
| 6,333,640 B1 | * | 12/2001 | Fant et al. | ...................... 326/35 |

* cited by examiner

*Primary Examiner*—Thuand Do
(74) *Attorney, Agent, or Firm*—Fitch, Even, Tabin & Flannery

(57) ABSTRACT

A method of global simplification of a netlist for an integrated circuit includes steps for generating a variable set representative of the inputs and outputs of logic elements in the netlist, re-ordering the inputs and corresponding outputs of the logic elements in the variable set, generating a key set representative of the inputs of the logic elements that are connected to the outputs, assigning names in the variable set that are representative of equivalent outputs having two or fewer essential variables to the same variable name, inserting names in the variable set representative of outputs having more than two essential variables, and assigning a value to each of the outputs having two or fewer essential variables.

20 Claims, 9 Drawing Sheets

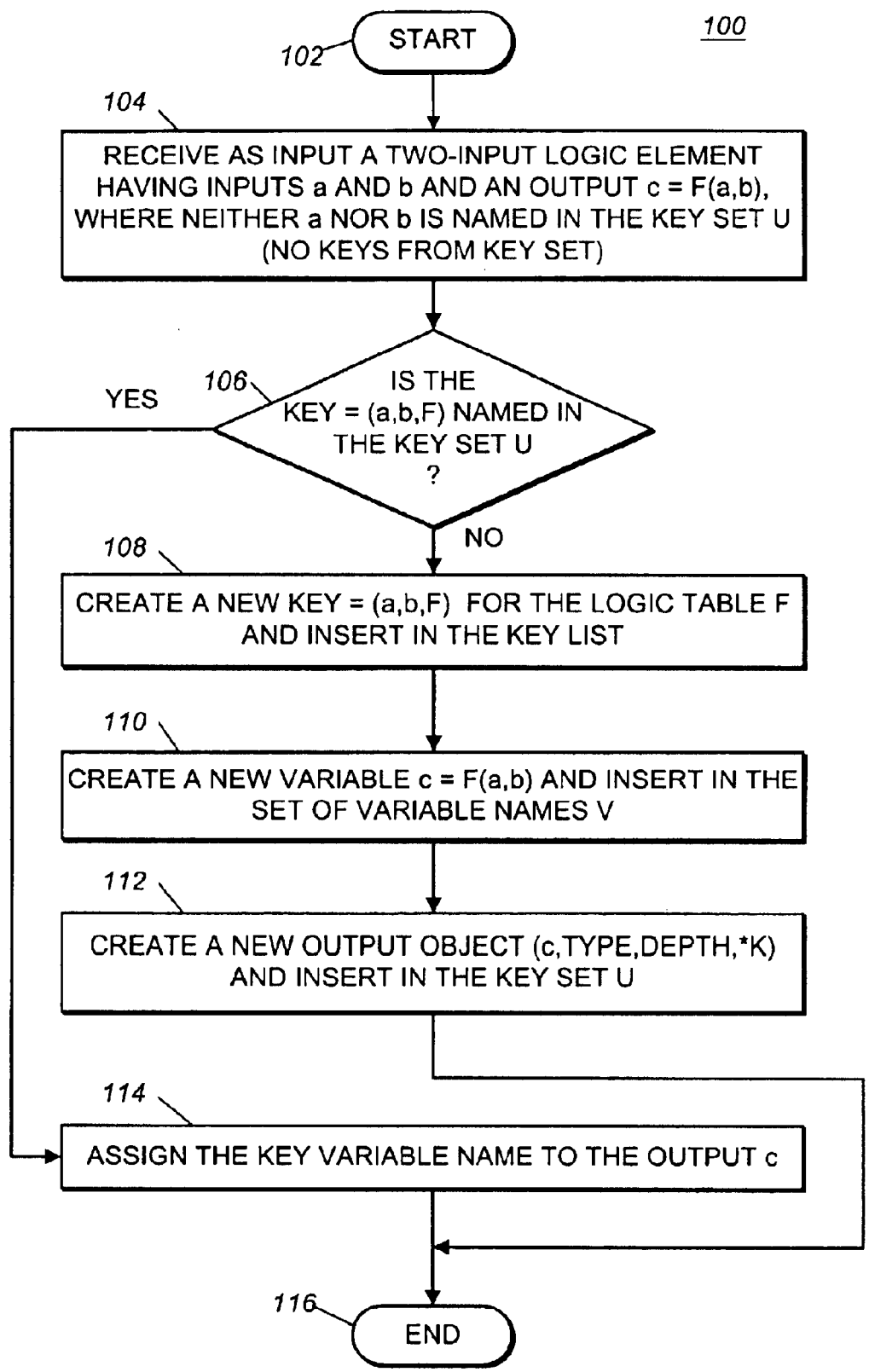
FIG._1

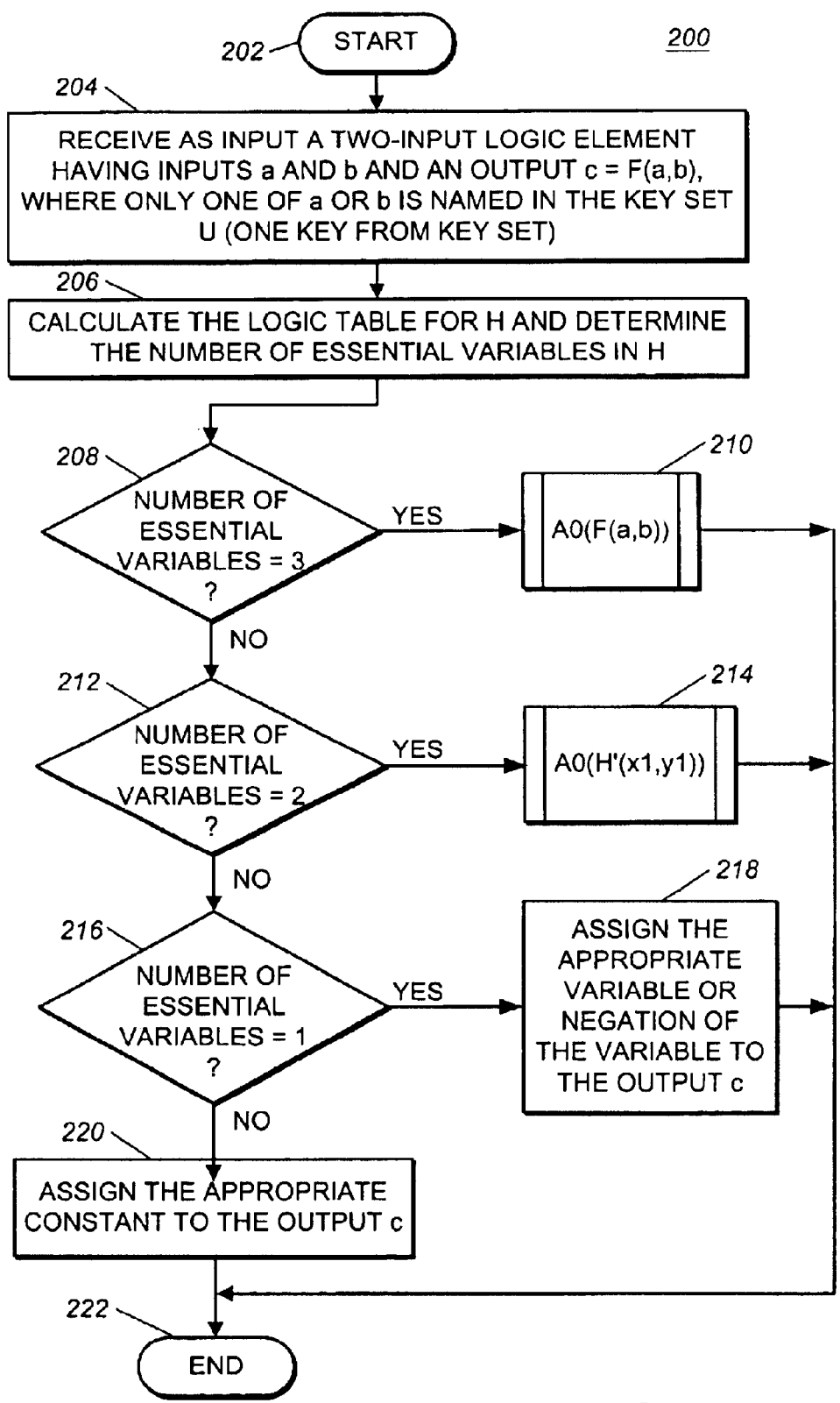
FIG._2

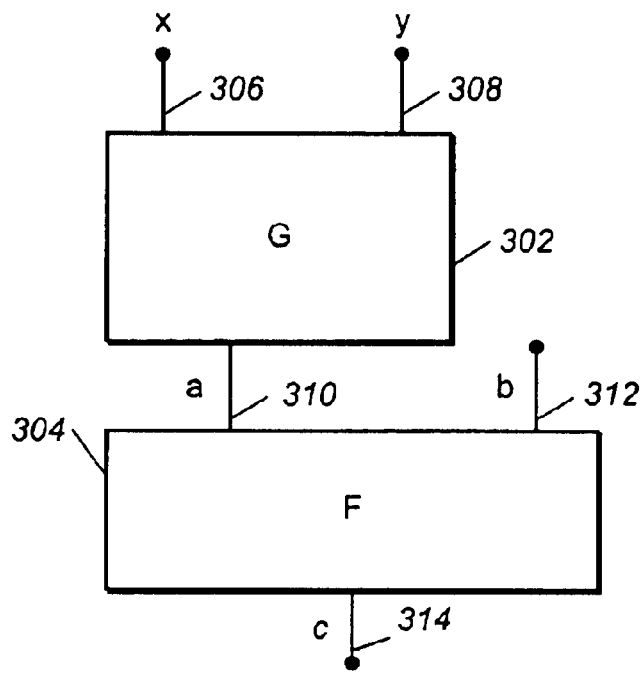
FIG._3
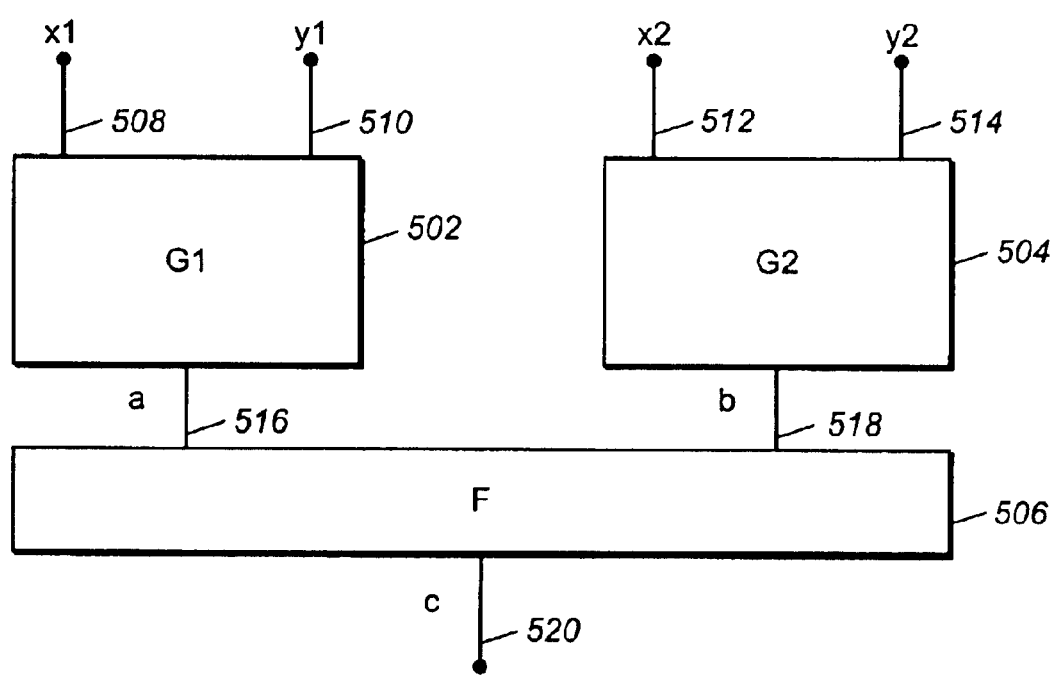
FIG._5

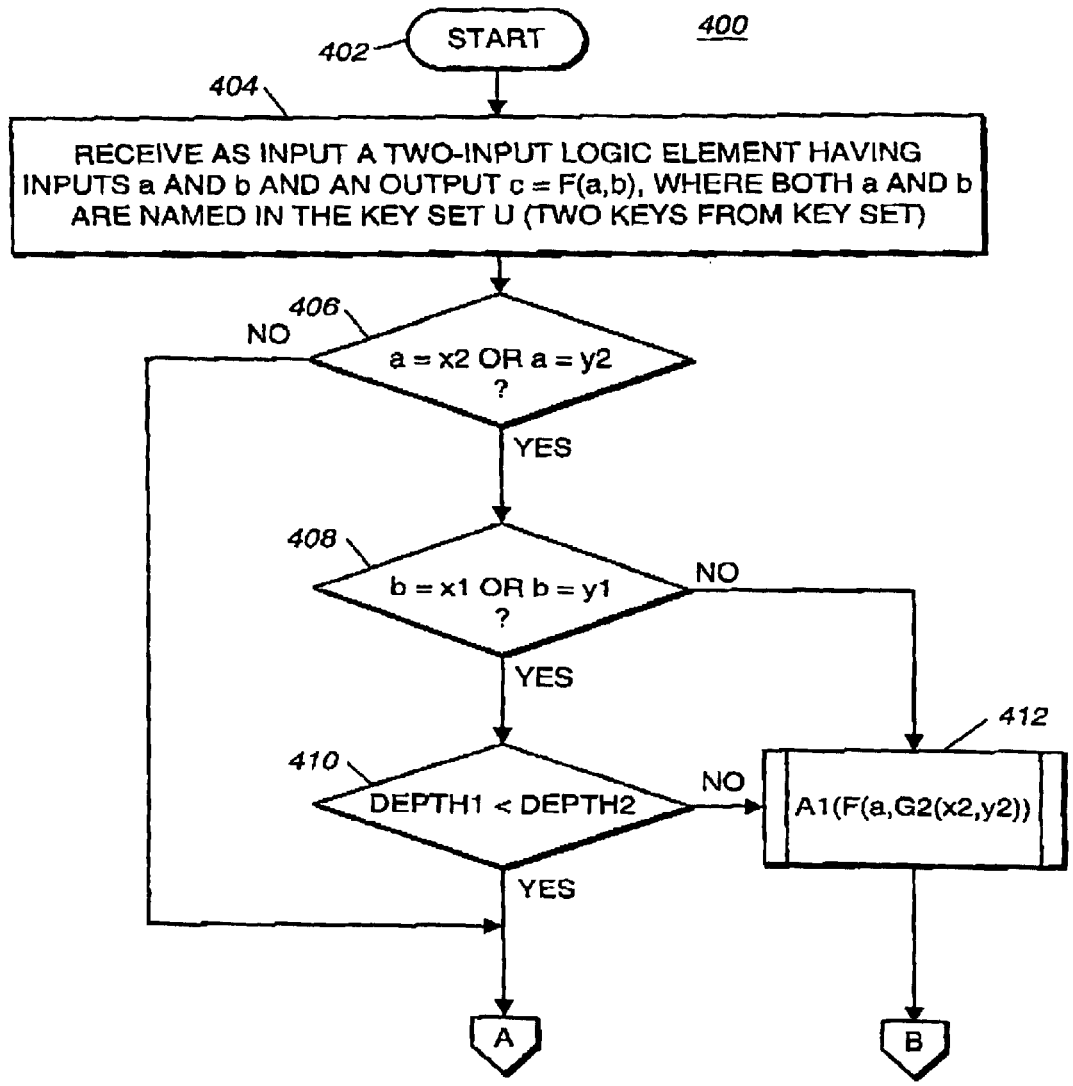
FIG._4A

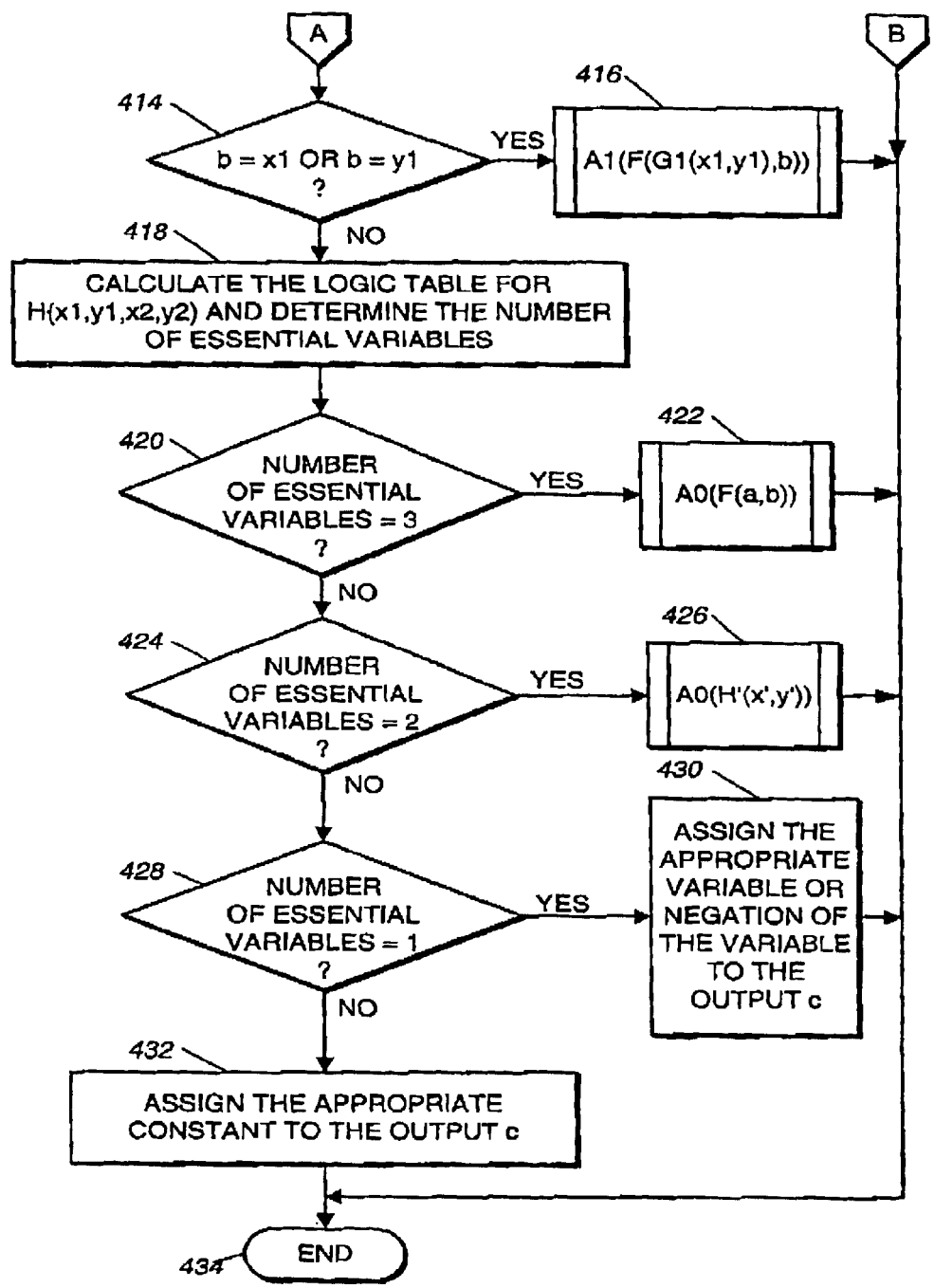
FIG._4B

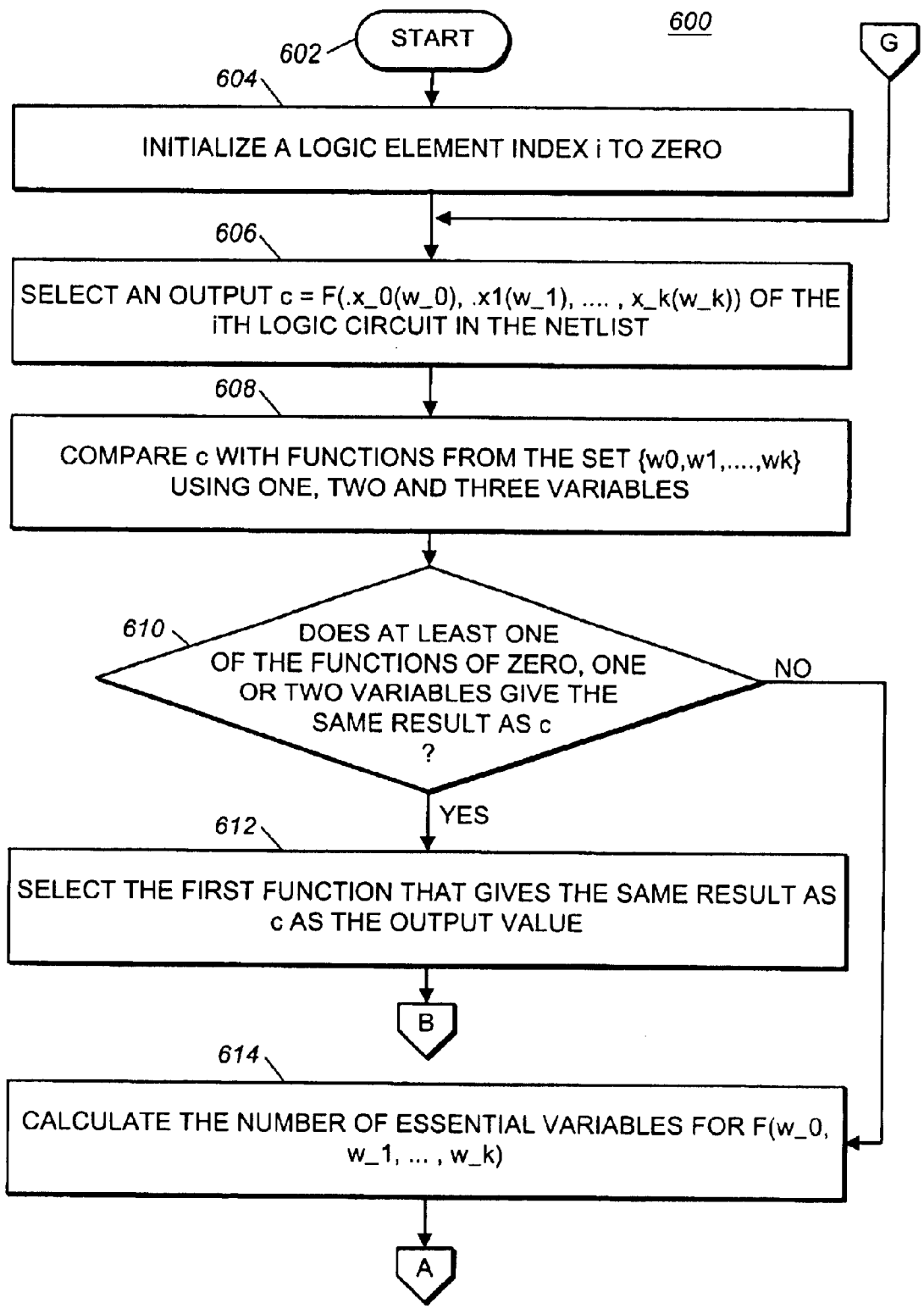
FIG._6A

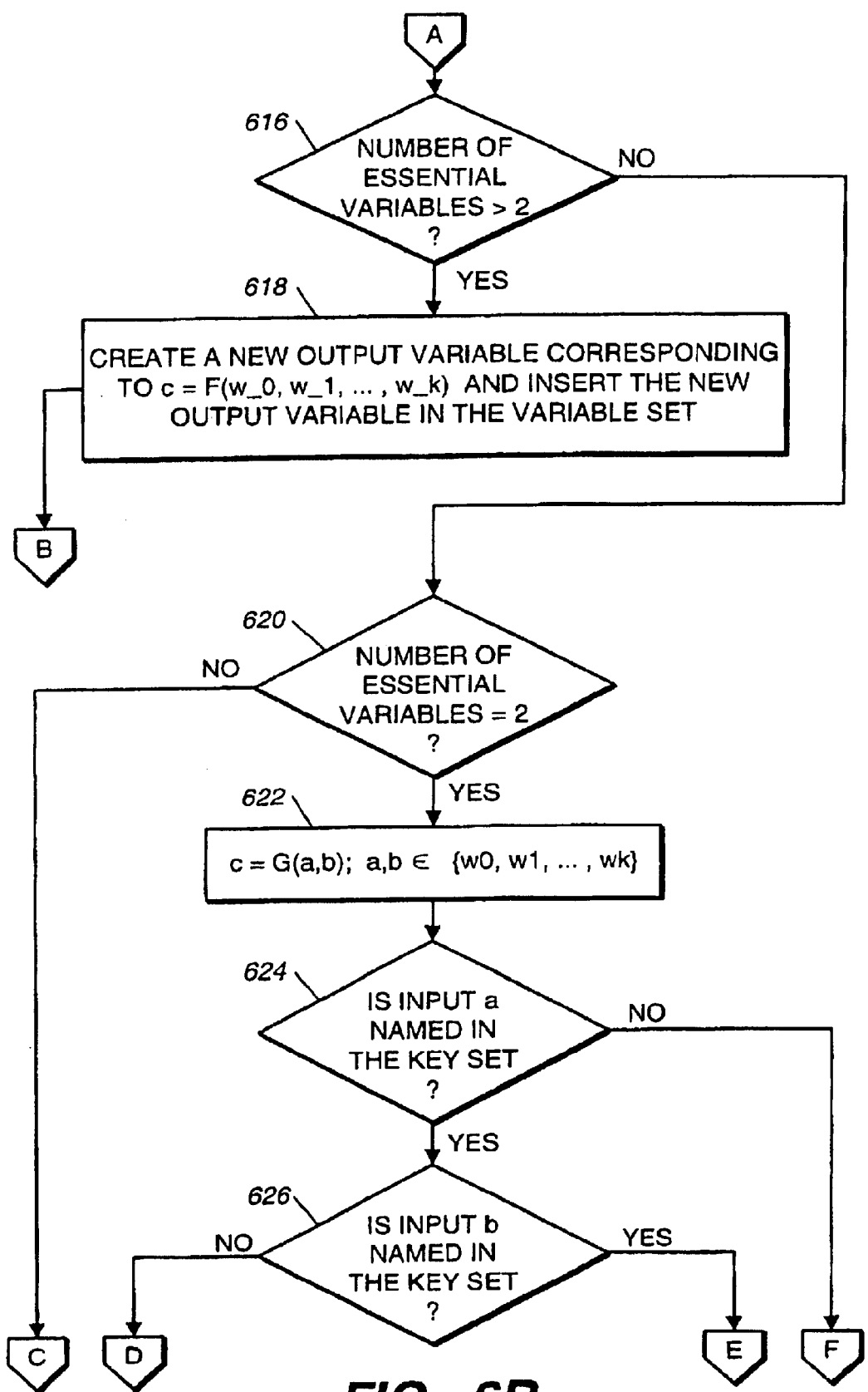
FIG._6B

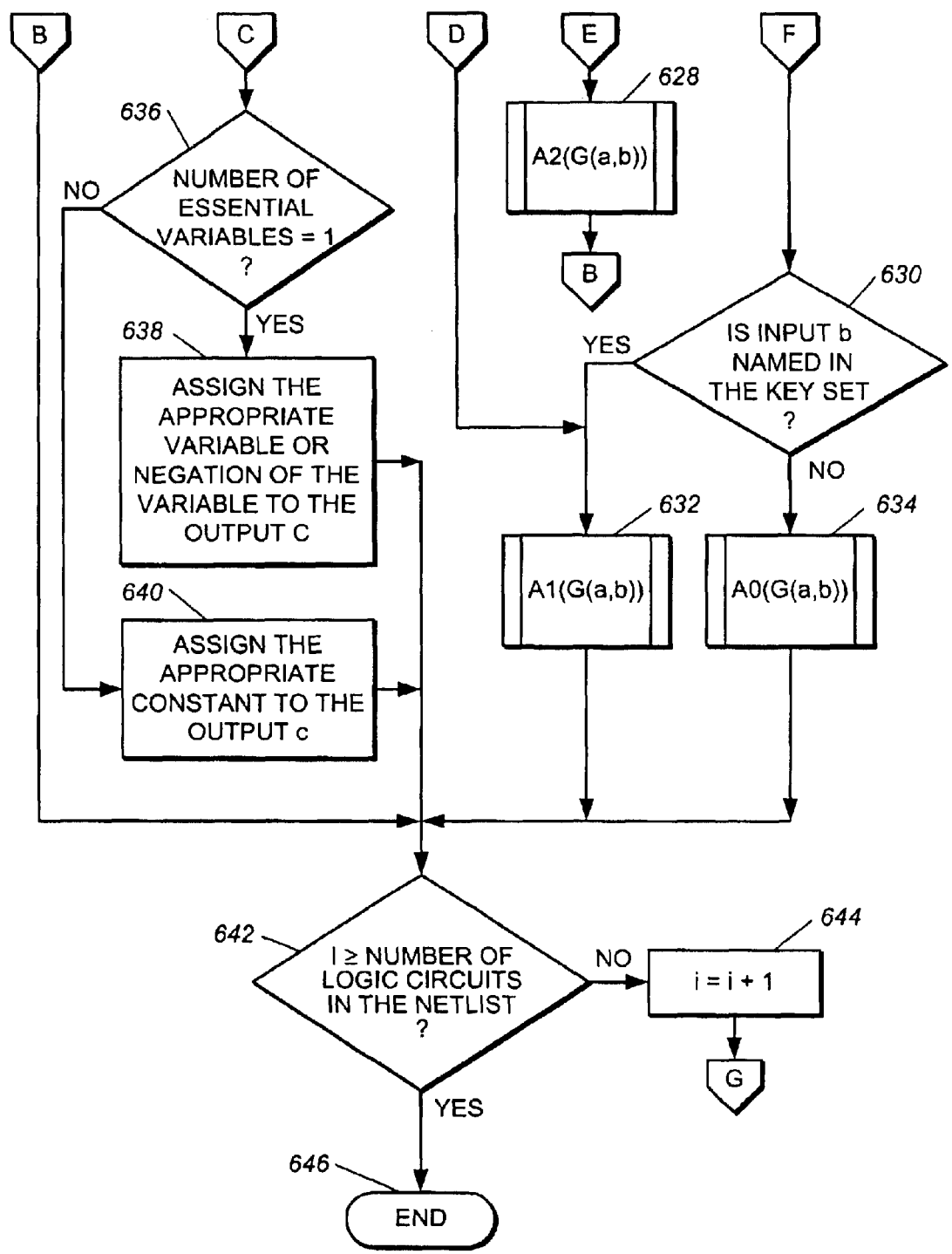
FIG._6C

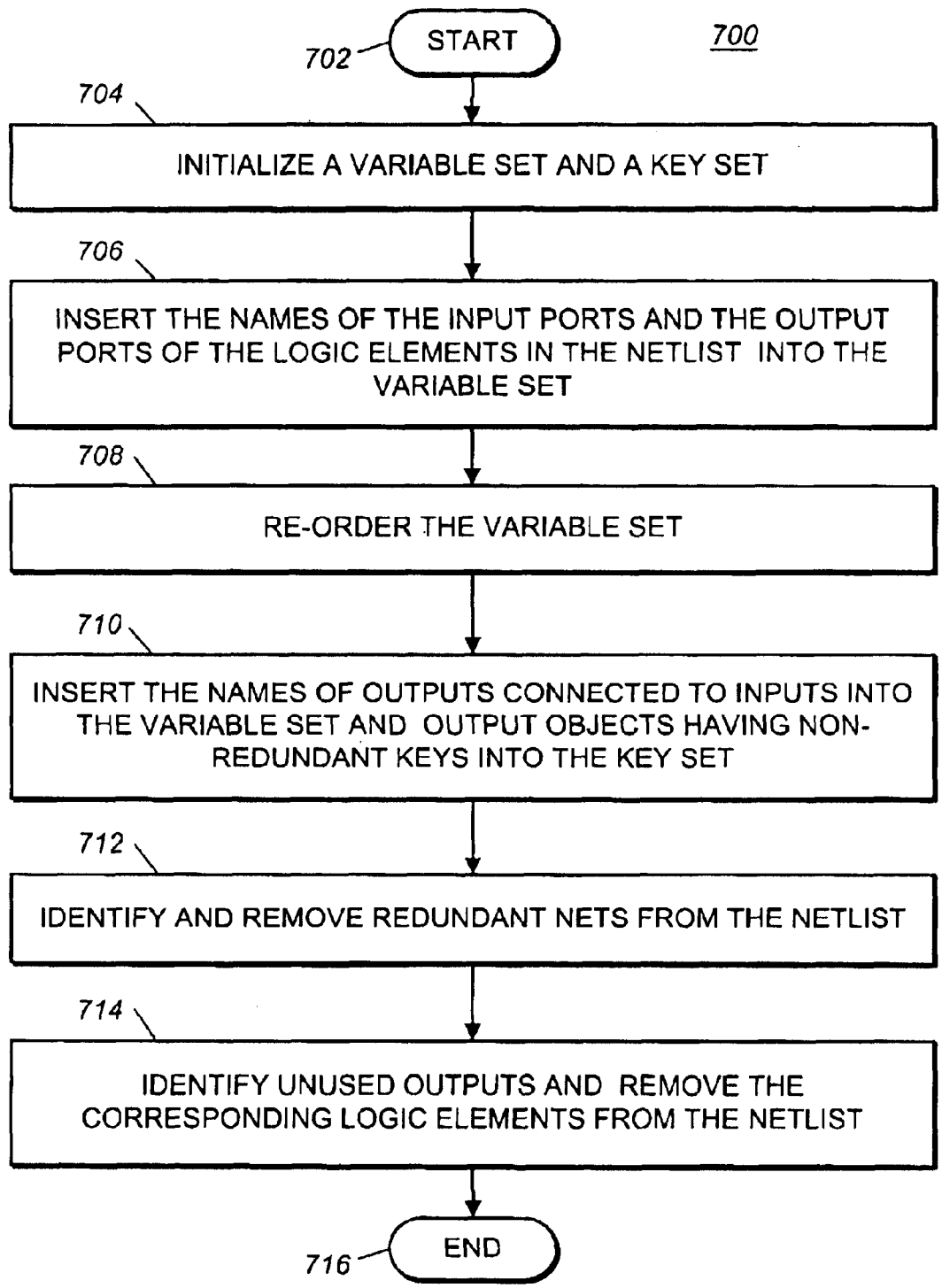
FIG._7

NETLIST REDUNDANCY DETECTION AND GLOBAL SIMPLIFICATION

BACKGROUND OF THE INVENTION

1. Field of the Invention

The present invention is directed to the manufacture of integrated circuits. More specifically, but without limitation thereto, the present invention is directed to a method of removing redundant circuits from a netlist for an integrated circuit.

2. Description of the Prior Art

When a netlist is compiled from register transfer level (RTL) code for a generic library, redundancies are frequently introduced. Examples of these redundancies are constants, equivalent nets, inverted pairs of nets, and other redundant fragments.

SUMMARY OF THE INVENTION

In one aspect of the present invention, a method of global simplification of a netlist includes steps for generating a variable set representative of the inputs and outputs of logic elements in the netlist, re-ordering the inputs and corresponding outputs of the logic elements in the variable set, generating a key set representative of the inputs of the logic elements that are connected to the outputs, assigning names in the variable set that are representative of equivalent outputs having two or fewer essential variables to the same variable name, inserting names in the variable set representative of outputs having more than two essential variables, and assigning a value to each of the outputs having two or fewer essential variables.

In another aspect of the present invention, a computer program product for global simplification of a netlist instructs the computer to perform steps for generating a variable set representative of the inputs and outputs of logic elements in the netlist, re-ordering the inputs and corresponding outputs of the logic elements in the variable set, generating a key set representative of the inputs of the logic elements that are connected to the outputs, assigning names in the variable set that are representative of equivalent outputs having two or fewer essential variables to the same variable name, inserting names in the variable set that are representative of outputs having more than two essential variables, and assigning a value to each of the outputs having two or fewer essential variables.

DESCRIPTION OF THE DRAWINGS

The present invention is illustrated by way of example and not limitation in the accompanying figures, in which like references indicate similar elements throughout the several views of the drawings, and in which:

FIG. 1 illustrates a flow chart for an algorithm A0 according to an embodiment of the present invention;

FIG. 2 illustrates a flow chart for an algorithm A1 according to an embodiment of the present invention;

FIG. 3 illustrates an example of a two-input logic element having only one input named in a key set U according to an embodiment of the present invention;

FIGS. 4A and 4B illustrate a flow chart for an algorithm A2 according to an embodiment of the present invention;

FIG. 5 illustrates an example of a two-input logic element having both inputs named in a key set U according to an embodiment of the present invention;

FIGS. 6A, 6B and 6C illustrate a flow chart for assigning each output in the netlist according to an embodiment of the present invention; and FIG. 7 illustrates a flow chart for a method of global simplification of a netlist according to an embodiment of the present invention.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

A generic library used in the design of integrated circuits typically contains netlists for standard logic cells, or logic elements, and for more complex logic elements used in comparators, adders, and other datapath operators. In one embodiment of the present invention, a netlist for a compiled logic element is transformed into a functionally equivalent, irredundant netlist using a dependencies database of functional tables of all the gates, that is, logic elements, in the generic library.

The following definitions are used to illustrate the algorithms used to effect the transformation of a compiled netlist into a functionally equivalent, irredundant netlist.

A set V is defined as a set $\{v_0, v_1, v_2, \ldots\}$ of variable names. A two-input logic function may be encoded as a triple (i1,i2,out), where i1 and i2 are indexes of corresponding elements in V, for example, $v_1$ and $v_2$, and out is the value of the function. For example, $\text{AND}(.a(v_{10}), .b(v_0))$ may be encoded as the triple (10,0,1), or key, where 10 is the index of $v_{10}$ and 0 is the index of $v_0$ from the variable set V, and 1=(0001) represents the function table for conjunction as shown in Table 1 below:

TABLE 1

| .a | .b | AND |
|---|---|---|
| 0 | 0 | 0 |
| 0 | 1 | 0 |
| 1 | 0 | 0 |
| 1 | 1 | 1 |

In another example, the exclusive OR function $\text{XOR}(.a(v_1), .b(v_4))$ may be encoded as the triple (1,4,6), where 6=(0110) is the function table for the XOR function as shown in Table 2 below:

TABLE 2

| .a | .b | XOR |
|---|---|---|
| 0 | 0 | 0 |
| 0 | 1 | 1 |
| 1 | 0 | 1 |
| 1 | 1 | 0 |

An output of a two-input logic element may be defined as:

$$\text{ref} = (\text{name}, \text{type}, \text{depth}, *\text{key}) \qquad (1)$$

where name is the name of the variable assigned to the output ref, type is the variable type, for example, variable, negation, and empty; depth is the maximum number of gates between the input ports of the logic element to the output ref, and *key is a pointer to the triple key(name) in a key list defining the function of the logic element. The definition expressed in formula (1) may also be used to describe any net. For example, for input ports, type=variable, depth=0, *key=NULL, and name is the name of the input port.

A key set may be defined as a set of outputs, where each output in the set is included in the key list, for example:

$$U=(ref_0, ref_1, \ldots ) \quad (2)$$

where $ref_0$, $ref_1$, . . . are each outputs as defined by formula (1). When an output, or object, is inserted into the key set U, corresponding objects for permutations, that is, reversed order, of the variables, and negations of the output are inserted also. In this example, there are four variants for each key: (i1, i2, out), (i2, i1, permut_out), (i1, i2, neg_out) and (i2, i1, neg_permut_out). Using the definitions and terminology described above, the outputs of all non-repeated sub-circuits of a given circuit for a logic function may be described by a single key set.

In one embodiment of the present invention, the following three algorithms are defined to effect the transformation of a compiled netlist into a functionally equivalent, irredundant netlist.

FIG. 1 illustrates a flow chart 100 for an algorithm A0 according to an embodiment of the present invention.

Step 102 is the entry point of the flow chart 100.

In step 104, a netlist for a two-input logic element having inputs a and b and an output c=F(a,b) is received as input where neither a nor b is named in the key set U (no keys from key set).

In step 106, if key=(a,b,F) corresponding to the output c=F(a,b) is not named in the key set U, then control is transferred to step 108. Otherwise, if key=(a,b,F) corresponding to the output c is named in the key set U, for example, as (d,type,depth,*key), then control is transferred to step 114.

In step 108, a new key=(a,b,F) is created for the logic table F and stored in the key list.

In step 110, a new variable c=F(a,b) is created and inserted in the set of variable names V.

In step 112, a new output object (c,type,depth,*key) is created and inserted in the key set U. Control is then transferred to step 116.

In step 114, the variable name d is assigned to the output c, that is, references to the output c in the netlist are mapped to the variable name d. In the final step of simplification where the net name c is not identical to its reference name d or to the negation of d, then the net c is redundant and will be deleted by renaming it to d.

Step 116 is the exit point for the flow chart 100.

FIG. 2 illustrates a flow chart 200 for an algorithm A1 according to an embodiment of the present invention;

Step 202 is the entry point of the flow chart 100.

In step 204, a two-input logic element having inputs a and b and an output c=F(a,b) is received as input where only one of the inputs a and b is named in the key set U (one key from key set), that is, there exists an output object (a,type,depth, *key) or (b,type,depth,*key) in the key set U where key= (x,y,G), that is, a=G(x,y) or b=G(x,y).

FIG. 3 illustrates an example of a two-input logic element having only one input named in a key set U according to an embodiment of the present invention. Shown in FIG. 3 are two-input logic elements 302 and 304, input x 306, input y 308, input a 310, input b 312, and an output c 314. In this example, the input a 306 is the output of the two-input logic element 302, that is, a=G(x,y), therefore the input a 306 of the logic element 304 is named in the key set U, while the input b 312 is not named in the key set U. Substituting for a in c=F(a,b) gives the result c=F(G(x,y),b)=H(x,y,b).

In step 206, the number of essential variables in F and the logic table for H is calculated. For example, if F(a,b)=a & b, G(x,y)=x XOR y, and b=x, then H(x,y,b)=F(G(x,y),b)=(x XOR y) & x=x & x XOR y & x=x XOR y & x=x & (1 XOR y)=x & (~y)=H'(x,y). In this algebraic example, x1=x, y1=y, and H=(0010).

In another example, using the table approach, H(x,y,b)= (00001100), and H(0,0,0)=0 !=H(1,0,0)=1, therefore x is an essential variable; H(1,0,0)=1 !=H(1,1,0)=0, therefore y is an essential variable; H(x,y,0)=H(x,y,1) for any combination of (x,y), therefore b is not an essential variable. A table reduction may then be made for non-essential variables (for this example, all output values for (x,y,1) are deleted), giving the result H'(x,y)=(0010).

In another example, using the program approach, all functions having no more than two essential variables from the set {x,y,b} (0,1,x,y,b,~x,~y,~b,x & y,x & b,x & (~y), . . . ) are compared. For g(x,y,b)=x & (~y), the logic table is (00001100) as it is for H.

In step 208, if the number of essential variables in F is equal to three, then control is transferred to step 210. Otherwise, control is transferred to step 212.

In step 210, the algorithm A0 is applied to the output c=F(a,b). Control is then transferred to step 222.

In step 212, if the number of essential variables in F is equal to two, then H(x,y,b)=H'(x1,y1), where x1,y1∈{x,y,b}. Control is then transferred to step 214. Otherwise, control is transferred to step 216.

In step 214, the algorithm A0 is applied to the output c=H'(x1,y1), and control is transferred to step 222.

In step 216, if the number of essential variables is equal to one then control is transferred to step 218. Otherwise, control is transferred to step 220.

In step 218, the appropriate variable or negation of the variable is assigned to the output c, and control is transferred to step 222.

In step 220, H has no essential variables, therefore c is constant, and the corresponding constant, for example, zero or one, is assigned to the output c. For example, if F(a,b)=a & (~b), G(x,y)=x & y, and b=x, then H(x,y,b)=F(G(x,y), b)=(x & y) & (~x)=0=H'.

Step 222 is the exit point for the flow chart 200.

FIGS. 4A and 4B illustrate a flow chart 400 for an algorithm A2 according to an embodiment of the present invention.

Step 402 is the entry point for the flow chart 400.

In step 404, a netlist for a two-input logic element having inputs a and b and an output c=F(a,b) is received as input where both of the inputs a and b are named in the key set U (two keys from key set), that is, the key set U contains an output object (a,type1,depth1,*key1), where key1=(x1,y1,G1), that is, a=G1(x1,y1), and an output object
(b,type2,depth2,*key2), where key2=(x,y,G2), that is, b=G2 (x2,y2)

FIG. 5 illustrates an example of a two-input logic element having both inputs named in a key set U according to an embodiment of the present invention. Shown in FIG. 5 are two-input logic elements 502, 504 and 506, input x1 508, input y1 510, input x2 512, input y2 514, input a 516, input b 518, and an output c 520. In this example, the input a 516 of the logic element 506 is the output of the two-input logic element 502, that is, a=G1(x1,y1), while the input b 518 of the logic element 506 is the output of the two-input logic element 504, that is, b=G2(x2,y2). Substituting for a and b in c=F(a,b) gives the result c=F(G1(x1,y1),G2(x2,y2))=H(x1,y1,x2,y2).

In step 406, if a is equal to x2 or a is equal to y2, control is transferred to step 408. Otherwise, if a is not equal to x2 or y2, control is transferred to step 414.

In step 408, if b is equal to x1 or b is equal to y1, control is transferred to step 410. Otherwise, if b is not equal to x1 or y1, then control is transferred to step 412.

In step 410, depth1 is compared to depth2 to construct a circuit having the smallest depth. If depth1 is less than depth2, then control is transferred to step 414. Otherwise, control is transferred to step 412.

In step 412, the algorithm A1 is applied to the output c=F(a,G2(x2,y2)), and control is transferred to step 434.

In step 414, if b is equal to x1 or b is equal to y1, control is transferred to step 416. Otherwise, if b is not equal to x1 or y1, then control is transferred to step 418.

In step 416, the algorithm A1 is applied to the output c=F(G1(x1,y1),b), and control is transferred to step 434.

In step 418, the logic table for H(x1,y1,x2,y2) is calculated and the number of essential variables in H is determined as described above for the algorithm A1.

In step 420, if the number of essential variables in H is equal to three, then control is transferred to step 422. Otherwise, control is transferred to step 424.

In step 422, the algorithm A0 is applied to the output c=F(a,b), and control is transferred to step 434.

In step 424, if the number of essential variables is equal to two, then control is transferred to step 426. Otherwise, control is transferred to step 428.

In step 426, the algorithm A0 is applied to the output c=H'(x',y'), where H'(x',y')=H(x1,y1,x2,y2) and x',y'∈{x1,y1,x2,y2}. Control is then transferred to step 434.

In step 428, if the number of essential variables is equal to one, then control is transferred to step 430. Otherwise, control is transferred to step 432.

In step 430, the appropriate variable or negation of the variable is assigned to the output c, and control is transferred to step 434.

In step 432, H has no essential variables, therefore c is constant, and the corresponding constant of zero or one is assigned to the output c.

Step 434 is the exit point for the flow chart 400.

FIGS. 6A, 6B and 6C illustrate a flow chart 600 for assigning each output in the netlist according to an embodiment of the present invention.

Step 602 is the entry point for the flow chart 600.

In step 604, a logic element index i is initialized to zero.

In step 606, an output c=F(.$x_0(w_0)$,.$x_1(w_1)$, . . . ,$x_k(w_k)$) of the i-th logic circuit in the netlist is selected, where each $w_0, w_1, \ldots, w_k$ is a variable or a negation of a variable from the variable set V, where k is the number of input ports for the i-th logic circuit.

In step 608, functions from the set {$w_0, w_1, \ldots, w_k$} using zero, one and two variables are compared with F.

In step 610, if at least one of the functions of zero, one or two variables exists that gives the same result as c, then control is transferred to step 612. For example, F($w_0,w_1,w_2$)=(00001100) and g($w_0,w_1,w_2$)=($w_0$& (~$w_2$)=(00001100) as described above for the algorithm A1. If no such function exists, control is transferred to step 614.

In step 612, the first function that gives the same result as c is selected as the output value and control is transferred to step 642.

In step 614, the number of essential variables is calculated for F($w_0, w_1, \ldots, w_k$). A variable $x_i$ is defined as essential to F($x_0, \ldots, x_i, \ldots, x_k$) if a subset of values ($a_0, \ldots, a_{i-1}, a_{i+1}, \ldots, a_k$) of variables ($x_0, \ldots, x_{i-1}, x_{i+1}, \ldots, x_k$) exists such that F($a_0, \ldots, a_{i-1}, 0, a_{i+1}, \ldots, a_k$) !=F($a_0, \ldots, a_{i-1}, 1, a_{i+1}, \ldots, a_k$). This is illustrated in the example of the table approach described above for the algorithm A1.

In step 616, if the number of essential variables for F is more than two, then control is transferred to step 618. Otherwise, control is transferred to step 620.

In step 618, a new output variable corresponding to c=F($w_0, w_1, \ldots, w_k$) is created and inserted in the variable set V. Control is then transferred to step 642.

In step 620, if the number of essential variables for F is equal to two, then control is transferred to step 622. Otherwise, control is transferred to step 636.

In step 622, the output c is set equal to G(a,b), where a,b∈{$w_0, w_1, \ldots, w_k$} are the essential variables determined above in step 614. Also, the logic table is reduced by deleting all output values except combinations of values for the variables (a,b), that is, ((0,0),(0,1),(1,0),(1,1)), as described above in the example of the table approach in algorithm A1.

In step 624, if the input a is named in the key set U, then control is transferred to step 626. Otherwise, control is transferred to step 630.

In step 626, if the input b is named in the key set U, then control is transferred to step 628. Otherwise, control is transferred to step 632.

In step 628, the algorithm A2 is applied to the output c=G(a,b), and control is transferred to step 642.

In step 630, if the input b is named in the key set U, then control is transferred to step 632. Otherwise, control is transferred to step 634.

In step 632, the algorithm A1 is applied to the output c=G(a,b), and control is transferred to step 642.

In step 634, the algorithm A0 is applied to the output c=G(a,b), and control is transferred to step 642.

In step 636, if the number of essential variables is equal to one, then control is transferred to step 638. Otherwise, control is transferred to step 640.

In step 638, the appropriate variable or negation of the variable is assigned to the output c, and control is transferred to step 642.

In step 640, the appropriate constant is assigned to c. For example, c may be wired to VSS if c is equal to zero or to VDD if c is equal to one.

In step 642, if i is greater than or equal to the number of logic circuits in the netlist, then control is transferred to step 646. Otherwise, control is transferred to step 644.

In step 644, i is incremented by one, and control is transferred to step 606.

Step 646 is the exit point of the flow chart 600.

In one aspect of the present invention, a method of global simplification of a netlist includes steps for generating a variable set representative of the inputs and outputs of logic elements in the netlist, re-ordering the inputs and corresponding outputs of the logic elements in the variable set, generating a key set representative of the inputs of the logic elements that are connected to the outputs, assigning names in the variable set that are representative of equivalent outputs having two or fewer essential variables to the same variable name, inserting names in the variable set representative of outputs having more than two essential variables, and assigning a value to each of the outputs having two or fewer essential variables.

FIG. 7 illustrates a flow chart 700 for a method of global simplification of a netlist according to an embodiment of the present invention.

Step 702 is the entry point of the flow chart 700.

In step 704, a variable set and a key set are created and initialized having no elements.

In step 706, the names of the input ports and the output ports of the logic elements in the netlist are inserted in the variable set.

In step 708, the variable set is re-ordered so that the inputs of the logic elements are ordered before the outputs. For example, if a logic element has inputs a and b and an output c, then the inputs a and b are ordered before the output c. The result defines a direct conus from the input ports to the outputs of each logic circuit in the netlist.

In step 710, the names of outputs connected to inputs are inserted into the variable set and output objects having non-redundant keys are inserted into the key set, for example, as described with reference to the flow chart of FIG. 6.

In step 712, the key set U now contains all non-redundant output objects and the corresponding negations for the two-input circuits of the netlist, and the variable set V contains a subset of all the nets. If the name of an input in the netlist is not found in the variable set V, then the net is redundant. The redundant nets are accordingly identified and removed from the netlist.

In step 714, a back conus for the netlist is constructed, that is, a graph of the paths from the output ports to the input ports is constructed. If there are outputs in the back conus that are not named in the variable set V, then these outputs are not used. Accordingly, these outputs and the corresponding logic elements are also removed from the netlist.

Step 716 is the exit point of the flow chart 600.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The methods illustrated in the flowchart descriptions above may be embodied in a computer program product and implemented by a computer according to well known programming techniques to perform the following functions:

generating a variable set representative of the inputs and outputs of logic elements in the netlist;

re-ordering the inputs and corresponding outputs of the logic elements in the variable set;

generating a key set representative of the inputs of the logic elements that are connected to the outputs;

assigning names in the variable set representative of equivalent outputs having two or fewer essential variables to the same variable name;

inserting names in the variable set that are representative of outputs having more than two essential variables; and assigning a value to each of the outputs having two or fewer essential variables.

In further embodiments of the computer program of the present invention, if the name of an input in the netlist is not found in the variable set, then the net is redundant and is accordingly removed from the netlist. Also, a back conus for the netlist may be constructed, that is, a graph of the paths from the outputs to the inputs. If there are outputs in the back conus that are not named in the variable set, then these outputs are not used. Accordingly, these outputs and the corresponding logic elements are also removed from the netlist.

While the invention herein disclosed has been described by means of specific embodiments and applications thereof, numerous modifications and variations may be made thereto by those skilled in the art without departing from the scope of the invention set forth in the following claims.

What is claimed is:

1. A method of global simplification of a netlist comprising steps for:

generating a variable set representative of inputs and outputs of logic elements in a netlist;

re-ordering the inputs and the outputs of the logic elements in the variable set so that the inputs are ordered before the outputs;

generating a key set representative of the inputs of the logic elements that are connected to the outputs;

assigning names in the variable set representative of equivalent outputs having two or fewer essential variables to the same variable name wherein a variable $x_i$ is defined as an essential variable of a logic function $F(x_0, \ldots, x_i, \ldots, x_k)$ if a subset of values $(a_0, \ldots, a_{i-1}, a_{i+1}, \ldots, a_k)$ of variables $(x_0, \ldots, x_{i-1}, x_{i+1}, \ldots, x_k)$ exists such that $F(a_0, \ldots, a_{i-1}, 0, a_{i+1}, \ldots, a_k)$ is not equal to $F(a_0, \ldots, a_{i-1}, 1, a_{i+1}, \ldots, a_k)$;

inserting names in the variable set that are representative of outputs having more than two essential variables; and assigning a value to each of the outputs having two or fewer essential variables.

2. The method of claim 1 further comprising a step for removing outputs from the netlist that are not named in the variable set.

3. The method of claim 1 further comprising a step for removing outputs from the netlist that are not used.

4. The method of claim 1 wherein the step of re-ordering the inputs and the outputs comprises constructing a direct conus of the netlist.

5. The method of claim 1 wherein the step of generating a variable set comprises inserting a name in the variable set of at least one of the outputs that was not previously connected to an input.

6. The method of claim 1 wherein the step of generating a key set comprises inserting an output object in the key set wherein the output object includes a key that was not previously calculated for one of the outputs.

7. A method of global simplification of a netlist comprising steps for:

generating a variable set representative of inputs and outputs of logic elements in a netlist;

re-ordering the inputs and the outputs of the logic elements in the variable set so that the inputs are ordered before the outputs;

generating a key set representative of the inputs of the logic elements that are connected to the output;

assigning names in the variable set representative of equivalent outputs having two or fewer essential variables to the same variable name wherein a variable $x_i$ is defined as an essential variable of a logic function $F(x_0, \ldots, x_i, \ldots, x_k)$ if a subset of values $(a_0, \ldots, a_{i-1}, a_{i+1}, \ldots, a_k)$ of variables $(x_0, \ldots, x_{i-1}, x_{i+1}, \ldots, x_k)$ exists such that $F(a_0, \ldots, a_{i-1}, 0, a_{i+1}, \ldots, a_k)$ is not equal to $F(a_0, \ldots, a_{i-1}, 1, a_{i+1}, \ldots, a_k)$;

inserting names in the variable net that are representative of outputs having more than two essential variables; and assigning a value to each of the outputs having two or fewer essential variables wherein the steps for generating a variable set and generating a key set comprise eteps for:

(a) initializing a logic element index i to zero;
(b) receiving an output $c=F(.x_0(w_0), .x_1(w_1), \ldots, x_k(w_k))$ of an i-th logic element in the netlist wherein $w_j$ is a variable or a negation of a variable from the variable set and wherein k is a number of variables of a logic function F;
(c) if at least one logic function for zero, one or two variables from a set $\{w_0, w_1, \ldots, w_k\}$ exists that is equivalent to the output c, then transferring control to step (d), else transferring control to step (e);
(d) assigning the logic function that is equivalent to the output c as an output value and transferring control to step (s);
(e) calculating a number of essential variables for the logic function $F(w_0, w_1, \ldots, w_k)$;
(f) if the number of essential variables is more than two, then transferring control to step (g); else transferring control to step (h);
(g) creating a new output variable corresponding to the output $c=F(w_0, w_1, \ldots, w_k)$ in the variable set and transferring control to step (s);
(h) if the number of essential variables is equal to two, then transferring control to step (i), else transferring control to step (p);
(i) setting the output c equal to a logic function G(a,b) wherein inputs $a,b \epsilon \{w_0, w_1, \ldots, w_k\}$;
(j) if the input a is named in the key set, then transferring control to step (k), else transferring control to step (m);
(k) if the input b is named in the key set, then transferring control to step (1), else transferring control to step (n);
(l) applying a first algorithm A2 to a logic function G(a,b) wherein the input a is equal to a logic function G1(x1, y1) and wherein the input is equal to a logic function G2(x2,y2) and transferring control to step (s);
(m) if the input b in named in the key set, then transferring control to step (n), else transferring control to step (o);
(n) applying a second algorithm A1 to a logic function G(x,y,b) or a logic function G(a,x,y) and transferring control to step (s);
(o) applying a third algorithm A0 to the logic function G(a,b) and transferring control to step (s);
(p) if the number of essential variables is equal to one, then transferring control to step (q), else transferring control to step (r);
(q) assigning an appropriate variable or a negation of the appropriate variable to the output c and transferring control to step (s);
(r) assigning an appropriate constant to the output c;
(s) if i is greater than or equal to a number of logic circuits in the netlist, then transferring control to step (u), else transferring control to step (t);
(t) incrementing i by one and transferring control to step (b); and
(u) terminating.

8. The method of claim 7 wherein the first algorithm A2 comprises steps for:
(a1) if the input a is equal to x2 or if the input a is equal to y2, then transferring control to step (a2), else transferring control to step (a5);
(a2) if the input b is equal to x1 or if the input b is equal to y1, then transferring control to step (a3), else transferring control to step (a4);
(a3) if a first circuit depth corresponding to x1 is less than a second circuit depth corresponding to x2, then transferring control to step (a5), else transferring control to step (a4);

(a4) applying the second algorithm A1 to the logic function F(a,G2(x2,y2)) and transferring control to step (a15);
(a5) if the input b is equal to x1 or if the input b is equal to y1, then transferring control to step (a6), else transferring control to step (a8);
(a6) applying the second algorithm A1 to the logic function F(G1(x1,y1),b) and transferring control to step (a15);
(a7) calculating a logic table for a logic function H(x1, y1,x2,y2) and determining a number of essential variables of the logic function H(x1,y1,x2,y2);
(a8) if the number of essential variables is more than two, then transferring control to step (a9), else transferring control to step (a10);
(a9) applying the third algorithm A0 to the logic function F(a,b) and transferring control to step (a15);
(a10) if the number of essential variables is equal to two, then transferring control to step (a11), else transferring control to step (a12);
(a11) applying the algorithm A0 to a logic function H'(x',y') wherein H'(x',y') is equal to the logic function H(x1,y1,x2,y2) and wherein $x',y' \epsilon \{x1,y1,x2,y2\}$, and transferring control to step (a15);
(a12) if the number of essential variables is equal to one, then transferring control to step (a13), else transferring control to step (a14);
(a13) assigning an appropriate variable or a negation of the appropriate variable to the output c and transferring control to step (a15);
(a14) assigning a corresponding constant of zero or one to the output c; and
(a15) terminating.

9. The method of claim 7 wherein the second algorithm A1 comprises steps for:
(b1) if the number of essential variables is equal to three, then transferring control to step (b2), else transferring control to step (b3);
(b2) applying the algorithm A0 to the output c=F(a,b), else transferring control to step (b8);
(b3) if the number of essential variables is equal to two, then setting a logic function H(x,y,b) equal to a logic function H'(x1,y1) wherein $x1,y1 \epsilon \{x,y,b\}$ and transferring control to step 214, else transferring control to step (b5);
(b4) applying the algorithm A0 to the output c=H'(x1,y1) and transferring control to step (b8);
(b5) if the number of essential variables is equal to two, then transferring control to step (b6), else transferring control to step (b7);
(b6) assigning an appropriate variable or a negation of the appropriate variable to the output c and transferring control to step (b8);
(b7) assigning a constant to the output c; and
(b8) terminating.

10. The method of claim 7 wherein the third algorithm A0 comprises steps for:
(c1) if key=(a,b,F) corresponding to the output c=F(a,b) is not named in the key set, then transferring control to step (c2), else transferring control to step (c5);
(c2) creating a new key=(a,b,F) for the logic logic function F in the key list;
(c3) creating a new variable name for the output c=F(a,b) in the set of variable names;

(c4) creating a new output object (c,type,depth,*key) in the key set and transferring control to step (c6);

(c5) assigning a variable name associated with the key= (a,b,F) to the output c; and (c6) terminating.

11. A computer program product for global simplification of a netlist comprising:

a medium for embodying a computer program for input to a computer; and a computer program embodied in the medium for causing the computer to perform steps for:

generating a variable set representative of inputs and outputs of logic elements in a netlist;

re-ordering the inputs and the outputs of the logic elements in the variable set so that the inputs are orderes before the outputs;

generating a key set representative of the inputs of the logic elements that are connected to the outputs;

assigning names in the variable set that are representative of equivalent outputs having two or fewer essential variables to the same variable name wherein a variable $x_i$ is defined as an essential variable of a logic function $F(x_0, \ldots, x_i, \ldots, x_k)$ if a subset of values $(a_0, \ldots, a_{i-1}, a_{i+1}, \ldots, a_k)$ of variables $(x_0, \ldots, x_{i-1}, x_{i+1}, \ldots, x_k)$ exists such that $F(a_0, \ldots, a_{i-1}, 0, a_{i+1}, \ldots, a_k)$ is not equal to $F(a_0, \ldots, a_{i-1}, 1, a_{i+1}, \ldots, a_k)$;

inserting names in the variable set representative of outputs having more than two essential variables; and assigning a value to each of the outputs having two or fewer essential variables.

12. The computer program product of claim 11 further comprising a step for removing a redundant net from the netlist that is not named in the variable set.

13. The computer program product of claim 11 further comprising steps for removing outputs from the netlist that are not used.

14. The computer program product of claim 11 wherein the step of re-ordering the inputs and the outputs comprises constructing a direct conus of the netlist.

15. The computer program product of claim 11 wherein the step of generating a variable set comprises inserting a name in the variable set of at least one of the outputs that was not previously connected to an input.

16. The computer program product of claim 11 wherein the step of generating a key set comprises inserting an output object in the key set wherein the output object includes a key that was not previously calculated for one of the outputs.

17. A computer program product for global simplification of a netlist comprising:

a medium for embodying a computer program for input to a computer; and a computer program embodied in the medium for causing the computer to perform steps for:

generating a variable set representative of inputs and outputs of logic elements in the netlist;

re-ordering the inputs and the outputs of the logic elements in the variable set so that the inputs are ordered before the outputs;

generating a key set representative of the inputs of the logic elements that are connected to the outputs;

assigning names in the variable set representative of equivalent outputs having two or fewer essential variables to the same variable name wherein a variable $x_i$ is defined as an essential variable of a logic function $F(x_0, \ldots, x_i, \ldots, x_k)$ if a subset of values $(a_0, \ldots, a_{i-1}, a_{i+1}, \ldots, a_k)$ of variables $(x_0, \ldots, x_{i-1}, x_{i+1}, \ldots, x_k)$ exists such that $F(a_0, \ldots, a_{i-1}, 0, a_{i+1}, \ldots, a_k)$ is not equal to $F(a_0, \ldots, a_{i-1}, 1, a_{i+1}, \ldots, a_k)$;

inserting names in the variable set representative of outputs having more than two essential variables; and assigning a value to each of the outputs having two or fewer essential variables wherein the steps for generating a variable set and generating a key set comprise steps for:

(a) initializing a logic element index i to zero;

(b) receiving an output $c=F(.x_0(w_0), .x_1(w_1), \ldots, x_k(w_k))$ of an i-th logic element in the netlist wherein $w_j$ is a variable or a negation of a variable from the variable set and wherein k is a number of variables of a logic function F;

(c) if at least one logic function for zero, one or two variables from a set $\{w_0, w_1, \ldots, wk\}$ exists that is equivalent to the output c, then transferring control to step (d), else transferring control to step (e);

(d) assigning the logic function that is equivalent to the output c as an output value and transferring control to step (s);

(e) calculating a number of essential variables for $F(w_0, w_1, \ldots, w_k)$;

(f) if the number of essential variables is more than two, then transferring control to step (g); else transferring control to step (h).

(g) creating a new output variable corresponding to the output $c=F(w_0, w_1, \ldots, w_k)$ in the variable set and transferring control to step (s);

(h) if the number of essential variables is equal to two, then transferring control to step (i), else transferring control to step (p);

(i) setting the output c equal to a logic function G(a,b) wherein inputs $a,b \in \{w_0, w_1, \ldots, w_k\}$;

(j) if the input a is named in the key set, then transferring control to step (k), else transferring control to step (m);

(k) if the input b is named in the key set, then transferring control to step (1), else transferring control to step (n);

(l) applying a first algorithm A2 to a logic function G(a,b) wherein the input a is equal to a logic function G1(x1, y1) and wherein the input b is equal to a a logic function G2(x2,y2) and transferring control to step (s);

(m) if the input b is named in the key set, then transferring control to step (n), else transferring control to step (o);

(n) applying a second algorithm A1 to a logic function G(x,y,b) or a logic function G(a,x,y) and transferring control to step (s);

(o) applying a third algorithm A0 to the logic function G(a,b) and transferring control to step (s);

(p) if the number of essential variables is equal to one, then transferring control to step (q), else transferring control to step (r);

(q) assigning an appropriate variable or a negation of the appropriate variable to the output c and transferring control to step (s);

(r) assigning an appropriate constant to the output c;

(s) if i is greater than or equal to the number of logic circuits in the netlist, then transferring control to step (u), else transferring control to step (t);

(t) incrementing i by one and transferring control to step (b); and (u) terminating.

18. The computer program product of claim 17 wherein the first algorithm A2 comprises steps for:

(a1) if the input a is equal to x2 or if the input a is equal to y2, then transferring control to step (a2), else transferring control to step (a5);

(a2) if the input b is equal to x1 or if the input b is equal to y1, then transferring control to step (a3), else transferring control to step (a4);

(a3) if a first circuit depth corresponding to x1 is less than a second circuit depth corresponding to x2, then transferring control to step (a5), else transferring control to step (a4);

(a4) applying the second algorithm A1 to the logic function F(a,G2(x2,y2)) and transferring control to step (a15);

(a5) if the input b is equal to x1 or if the input b is equal to y1, then transferring control to step (a6), else transferring control to step (a8);

(a6) applying the second algorithm A1 to the logic function F(G1(x1,y1),b) and transferring control to step (a15);

(a7) calculating a logic table for a logic function H(x1,y1,x2,y2) and determining a number of essential variables of the logic function H(x1,y1,x2,y2);

(a8) if the number of essential variables is more than two, then transferring control to step (a9), else transferring control to step (a10);

(a9) applying the third algorithm A0 to the logic function F(a,b) and transferring control to step (a15);

(a10) if the number of essential variables is equal to two, then transferring control to step (a11), else transferring control to step (a12);

(a11) applying the algorithm A0 to a logic function H'(x',y') wherein the logic function H'(x',y') is equal to the logic function H(x1,y1,x2,y2) and wherein x',y'∈{x1,y1,x2,y2}, and transferring control to step (a15);

(a12) if the number of essential variables is equal to one, then transferring control to step (a13), else transferring control to step (a14);

(a13) assigning an appropriate variable or a negation of the appropriate variable to the output c and transferring control to step (a15);

(a14) assigning a constant of zero or one to the output c; and (a15) terminating.

19. The computer program product of claim 17 wherein the second algorithm A1 comprises steps for:

(b1) if the number of essential variables is equal to three, then transferring control to step (b2), else transferring control to step (b3);

(b2) applying the algorithm A0 to the output c=F(a,b), else transferring control to step (b8).

(b3) if the number of essential variables is equal to two, then setting a logic function H(x,y,b) equal to a logic function H'(x1,y1) wherein x1,y1∈{x,y,b} and transferring control to step 214, else transferring control to step (b5);

(b4) applying the algorithm A0 to the output c=H'(x1,y1) and transferring control to step (b8);

(b5) if the number of essential variables is equal to one, then transferring control to step (b6), else transferring control to step (b7);

(b6) assigning an appropriate variable or a negation of the appropriate variable to the output c and transferring control to step (b8);

(b7) assigning a constant to the output c; and (b8) terminating.

20. The computer program product of claim 17 wherein the third algorithm A0 comprises steps for:

(c1) if key=(a,b,F) corresponding to the output c=F(a,b) is not named in the key set, then transferring control to step (c2), else transferring control to step (c5);

(c2) creating a new key=(a,b,F) for the logic function F in the key list;

(c3) creating a new variable name for the output c=F(a,b) in the set of variable names;

(c4) creating a new output object (c,type,depth,*key) in the key set and transferring control to step (c6);

(c5) assigning a variable name associated with the key=(a,b,F) to the output c; and (c6) terminating.

* * * * *